United States Patent
Mills et al.

(10) Patent No.: US 7,194,565 B2
(45) Date of Patent: Mar. 20, 2007

(54) NESTED REMOVABLE-REMOVABLE EXPANSION MODULES

(75) Inventors: Kevin J. Mills, Palo Alto, CA (US); Michael L. Gifford, San Leandro, CA (US)

(73) Assignee: Socket Communications, Inc., Newark, CA (US)

( * ) Notice: Subject to any disclaimer, the term of this patent is extended or adjusted under 35 U.S.C. 154(b) by 0 days.

(21) Appl. No.: 10/774,761

(22) Filed: Feb. 9, 2004

(65) Prior Publication Data

US 2004/0268001 A1     Dec. 30, 2004

Related U.S. Application Data

(63) Continuation of application No. 10/036,468, filed on Jan. 7, 2002, now Pat. No. 6,691,196, which is a continuation of application No. 09/309,373, filed on May 11, 1999, now Pat. No. 6,353,870.

(51) Int. Cl.
*G06F 13/00*     (2006.01)

(52) U.S. Cl. ...................... 710/301; 711/115

(58) Field of Classification Search ............... None
See application file for complete search history.

(56) References Cited

U.S. PATENT DOCUMENTS

| | | | |
|---|---|---|---|
| 4,744,006 A | 5/1988 | Duffield | 361/686 |
| 5,049,728 A | 9/1991 | Rovin | 235/492 |

(Continued)

FOREIGN PATENT DOCUMENTS

GB        2365182 B       2/2004

OTHER PUBLICATIONS

*MultiMediaCard System Summay Version 2.0*, MMCA, Jan. 1999.

(Continued)

*Primary Examiner*—Glenn A. Auve
(74) *Attorney, Agent, or Firm*—PatentVentures; Bennett Smith; Korbin Van Dyke

(57) ABSTRACT

Methods and apparatus for closed-case removable expansion cards having a removable memory enhance the utility of portable computer hosts, such as PDAs. In both a first and second embodiments the closed-case removable expansion cards preferably use a Type II CompactFlash form factor. In the first embodiment the removable memory is in combination with an external-I/O connector or attached external-I/O device, providing both I/O and memory functions in a single closed-case removable expansion card. This increases the expansion functional density for portable computer hosts, such as PDAs. That is, it increases the amount of functionality that can be accommodated within a given volume allocation for expansion devices. In the second embodiment the removable memory is a private memory for application specific circuitry within the closed-case-removable expansion card. This enhances the utility of portable computer hosts, such as PDAs, as universal chassises for application specific uses. The standard CompactFlash physical and electrical interface couples the application specific card to the host, which provides user interface functions for the application. The cards include a top located slot and an internal connector for accepting a MultiMediaCard as the private removable memory. In addition, the application specific card will generally have some manner of I/O to required external devices, such as scanning devices, sensors, or transducers. Otherwise, all functionality for the application specific function is self-contained within the application specific card.

54 Claims, 15 Drawing Sheets

U.S. PATENT DOCUMENTS

| | | | |
|---|---|---|---|
| 5,184,282 A | 2/1993 | Kaneda et al. | 361/395 |
| 5,291,584 A | 3/1994 | Challa et al. | 395/500 |
| 5,320,552 A | 6/1994 | Reichardt et al. | |
| 5,491,774 A | 2/1996 | Norris et al. | 395/2.79 |
| 5,519,577 A | 5/1996 | Dudas et al. | 361/737 |
| 5,545,057 A | 8/1996 | Tan et al. | 439/540.1 |
| 5,550,709 A | 8/1996 | Iwasaki | 361/684 |
| 5,563,400 A | 10/1996 | Le Roux | 235/486 |
| 5,566,290 A | 10/1996 | Silverbrook | 395/173 |
| 5,579,430 A | 11/1996 | Grill et al. | 395/2.12 |
| 5,594,873 A | 1/1997 | Garrett | |
| 5,611,055 A | 3/1997 | Krishan et al. | 395/281 |
| 5,611,057 A | 3/1997 | Pecone et al. | 710/102 |
| 5,615,344 A | 3/1997 | Corder | 395/309 |
| 5,619,396 A | 4/1997 | Gee et al. | 361/686 |
| 5,661,635 A | 8/1997 | Huffman et al. | 361/684 |
| 5,663,901 A | 9/1997 | Wallace et al. | 365/52 |
| 5,671,374 A | 9/1997 | Postman et al. | 395/309 |
| 5,675,734 A | 10/1997 | Hair | 395/200.01 |
| 5,679,007 A | 10/1997 | Potdevin et al. | 439/76.1 |
| 5,752,857 A | 5/1998 | Knights | 439/638 |
| 5,778,195 A * | 7/1998 | Gochi | 710/301 |
| 5,818,030 A | 10/1998 | Reyes | 235/492 |
| 5,839,108 A | 11/1998 | Daberko et al. | 704/270 |
| 5,876,218 A | 3/1999 | Liebenow et al. | 439/74 |
| 5,887,145 A | 3/1999 | Harari et al. | 395/282 |
| 5,890,016 A * | 3/1999 | Tso | 710/64 |
| 5,892,213 A | 4/1999 | Ito et al. | 235/441 |
| 5,906,516 A | 5/1999 | Sato et al. | 439/630 |
| 5,928,347 A | 7/1999 | Jones | 710/129 |
| 5,933,328 A | 8/1999 | Wallace et al. | 257/678 |
| 5,971,280 A | 10/1999 | Hoolhorst | |
| 5,986,891 A | 11/1999 | Sugimoto | |
| 6,002,605 A * | 12/1999 | Iwasaki et al. | 365/51 |
| 6,053,748 A * | 4/2000 | Bricaud et al. | 439/76.1 |
| 6,085,412 A | 7/2000 | Iwasaki | 29/827 |
| 6,091,137 A | 7/2000 | Fukuda | 257/679 |
| 6,097,605 A | 8/2000 | Klatt et al. | 361/737 |
| 6,102,714 A | 8/2000 | Oliphant et al. | 439/131 |
| 6,222,726 B1 | 4/2001 | Cha | 361/683 |
| 6,276,943 B1 | 8/2001 | Boutros et al. | |
| 6,293,464 B1 | 9/2001 | Smalley, Jr. | 235/435 |
| 6,353,870 B1 | 3/2002 | Mills et al. | |
| 6,599,147 B1 | 7/2003 | Mills et al. | |
| 6,691,196 B2 | 2/2004 | Mills et al. | |
| 6,721,819 B2 * | 4/2004 | Estakhri et al. | 710/11 |
| 6,863,557 B2 | 3/2005 | Mills et al. | |
| 6,920,517 B2 | 7/2005 | Mills et al. | |
| 6,976,111 B1 * | 12/2005 | Mills et al. | 710/301 |

OTHER PUBLICATIONS

Wes Brewer, *Smart Solutions for Smart Phones*, SanDisk Corporation, 1998.

*CompactFlash Specification Revision 1.3*, CompactFlash Association, 1998.

*PC Cards and CompactFlash Size CF+ Cards for Ethernet, Serial Communications, Bar Code Scanning and Data Collection*, Socket Communications, Inc., 1998.

*SanDisk CompatFlash*, SanDisk Corporation, Apr. 1998.

*SanDisk MultiMediaCard*, SanDisk Corporation, Nov. 1997.

Apr. 30, 2001 PCT Written Opinion for related International application No. PCT/US00/12796, filed May 9, 2000.

Apr. 24, 2003 UK Examination Report (case subsequently patented as GB 2365182 B, above).

* cited by examiner

Legend

| Pin No. | Name | Type | Description |
|---|---|---|---|
| 1 | RSV | NC | Reserved for future use |
| 2 | CMD | I/O/Push-Pull/Open-Drain | Command/Response |
| 3 | $V_{SS1}$ | Supply | Supply voltage ground |
| 4 | $V_{DD}$ | Supply | Supply voltage |
| 5 | CLK | I | Clock |
| 6 | $V_{SS2}$ | Supply | Supply voltage ground |
| 7 | DAT | I/O/Push-Pull | Data |

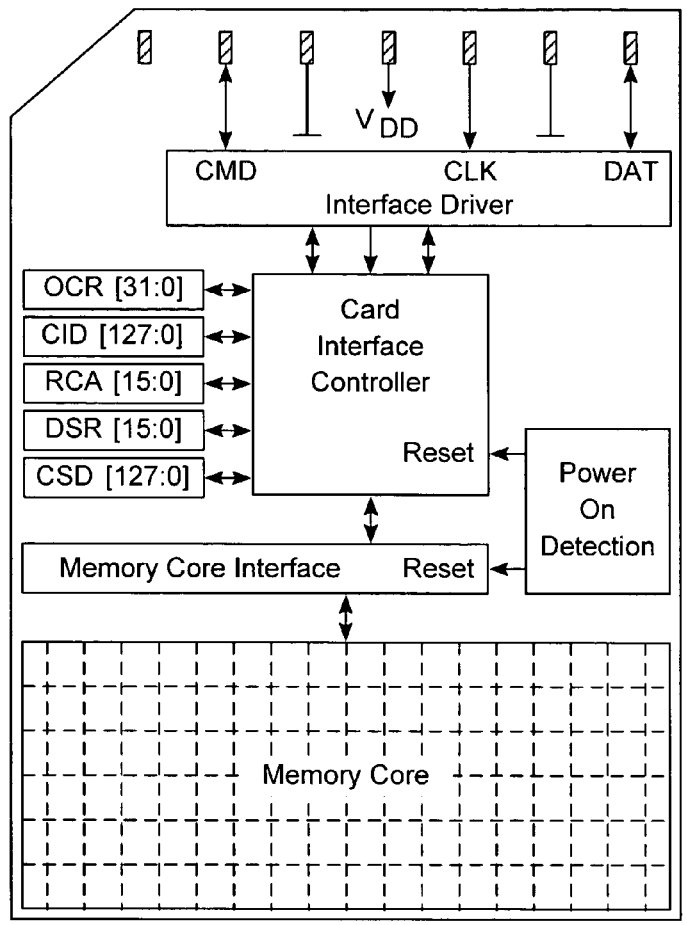

FIG. 3A
(PRIOR ART)

Legend

| Name | Width | Description |
|---|---|---|
| CID | 128 | Card identification number, card individual number for identification. Mandatory. |
| RCA | 16 | Relative card address, local system address of a card, dynamically assigned by the host during initialization. Mandatory. |
| DSR | 16 | Driver stage register to configure the card's output drivers. Optional. |
| CSD | 128 | Card specific data, information about the card operation conditions. Mandatory. |
| OCR | 32 | Operation condition register for cards which do not support the full voltage range. Used by a special broad-cast command to detect restricted cards. Optional. |

FIG. 3B
(PRIOR ART)

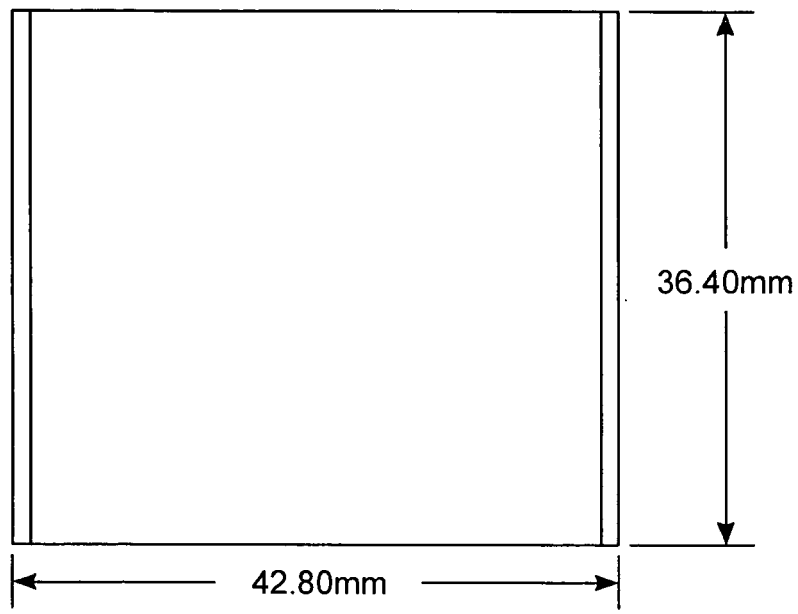
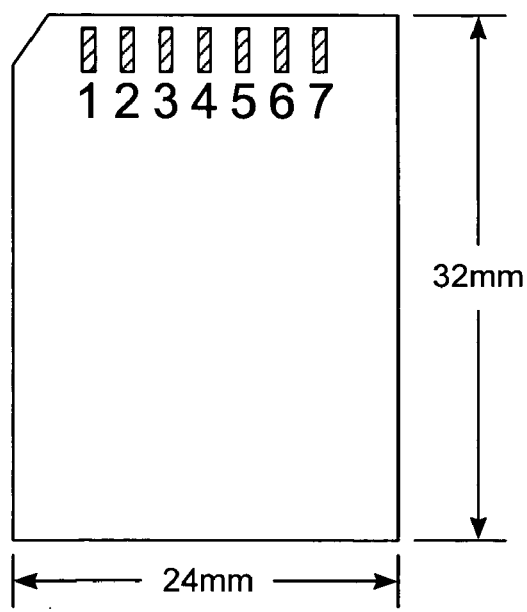
FIG. 6A
(PRIOR ART)

NESTED REMOVABLE-REMOVABLE EXPANSION MODULES

FIELD

The invention is related to closed-case removable expansion cards for computer hosts, such cards having particular application to portable computer hosts such as handheld computing devices.

BACKGROUND

The broad use of portable host computers, including Personal Digital Assistants (PDAs), has been severely hampered by limited capabilities for expansion or customization. Expansion and application customization has been performed via only one, or at most two, slots for removable expansion cards for I/O, I/O adapters, memories, and memory adapters. Memory expansion cards have included DRAM, SRAM, ROM, and Flash technologies. I/O expansion cards have included dedicated peripherals, networking, modems, wireless communications, serial I/O, and bar-code and other scanners.

Having only one slot meant choosing between memory or peripheral expansion. In two-slot implementations, one of the slots is generally used for peripheral expansion, and the other for memory expansion. As market forces and consumer demand are pushing future PDAs to be ever smaller, allocating packaging volume for two-slots will be increasingly viewed as a costly and nonviable solution.

Memory and Expansion Card Standards

Two of the most popular industry standards for the slots and removable cards are the PC Card and the CompactFlash Card. The PC Card has a 16-bit variant, previously known as a PCMCIA card, and a newer 32-bit variant, also known as a Card-Bus card. U.S. Pat. No. 5,815,426 ('426), ADAPTER FOR INTERFACING AN INSERTABLE/REMOVABLE DIGITAL MEMORY APPARATUS TO A HOST DATA PART, assigned to Nexcom Technology, and hereby incorporated by reference, describes these and other removable expansion card and memory types suitable for PDAs. In addition to the PC Card and CompactFlash Card formats, the '426 patent includes discussions of and references to Miniature Cards, Sold State Floppy Disk Cards (SSFDCs), MultiMediaCards (MMC), Integrated Circuit (IC) Cards (also known as Smart Cards), and Subscriber Identification Module (SIM) Cards.

CompactFlash Card

FIGS. 1A, 1B, and 1C are different views of a prior art Type II CompactFlash Card. The CompactFlash physical, electrical, and software interface architecture is taught in the CompactFlash Specification Revision 1.3, Copyright 1998, by the CompactFlash Association, P.O. Box 51537, Palo Alto, Calif. 94303, which is hereby incorporated by reference. FIGS. 1A, 1B, 1C, part of 6A, and part of 6B are reproduced or derived from the CompactFlash Specification document.

U.S. Pat. No. 5,887,145 ('145), REMOVABLE MOTHER/DAUGHTER PERIPHERAL CARD, assigned to SanDisk Corporation, and hereby incorporated by reference, describes the required features of host systems for CompactFlash Cards, including controllers required by CompactFlash memory cards (CF cards) and comprehensive controllers required by CompactFlash memory and I/O cards (CF+ cards).

MultiMediaCard

FIGS. 2A and 2B represent a prior art MultiMediaCard form factor and its pad definitions. FIGS. 3A and 3B represent the prior art internal architecture of a generic MultiMediaCard and its registers. FIG. 4A illustrates the prior art functional partitioning of a generic MultiMediaCard system. FIG. 5 illustrates the prior art physical partitioning of a generic MultiMediaCard system.

The MMC and MMC related system issues are taught in the MultiMediaCard System Summary Version 2.0, Copyright January 1999, by the MultiMediaCard Association, 19672 Stevens Creek Blvd., #404, Cupertino, Calif. 95014-2465, which is hereby incorporated by reference. FIGS. 2A, 2B, 3A, 3B, 4, 5, and part of 6A are reproduced or derived from the MultiMediaCard System Summary document.

FIGS. 6A and 6B are different views comparing the form factors of the prior art CompactFlash Card (top) and MultiMediaCard (bottom). In each of 6A and 6B, the CompactFlash Card and the MultiMediaCard are both roughly to equal scale.

Adapters for Removable Memories

Adapters exist or have been prophetically disclosed for physically and electrically coupling a removable memory on a slide, or stick, to a portable host via a removable expansion card of either the PCMCIA Card or CompactFlash Card form factors. The previously mentioned '426 patent describes such removable memory adapters. The focus of these existing memory adapters has been limited to merely providing an interface adapter, or bridge, between a first interface type (the host to removable-expansion-card interface) and a second interface type (the removable memory stick).

PC Card Mother and CompactFlash Card Daughter Combinations

Adapters exist or have been prophetically disclosed that comprise a special mother PC Card designed to accept one or more daughter CompactFlash Cards of one or more types. The previously '145 patent describes such CompactFlash adapters. The focus of these existing mother/daughter combinations has also been limited. First, the daughters have been used for memory expansion for the host platform, primarily in the form of flash-memory-based mass-storage-like devices. In this first approach, the mother card provides the requisite mass-storage controller functionality. Second, the daughters have been used for dedicated peripheral, I/O, or communication functions. In this second approach, the mother card has a so-called comprehensive controller that augments the mass-storage controller functionality with functions commonly required or useful to multiple daughter cards. Third, in a variation of either of the first two paradigms, functions of the general-purpose host may be relocated to the mother card.

Background for PC-Card Based I/O Functions

Techniques are known in the art for making and using systems that perform such I/O functions in a PC card. For example, see U.S. Pat. No. 5,671,374 ('374), PCMCIA INTERFACE CARD COUPLING INPUT DEVICES SUCH AS BARCODE SCANNING ENGINES TO PERSONAL DIGITAL ASSISTANTS AND PALMTOP COMPUTERS, assigned to TPS Electronics, which is hereby incorporated by reference. The '374 patent teaches the use of PDAs and similar hosts equipped with PC card interfaces for I/O devices including portable laser-scanners, magnetic stripe and ink readers, keyboards and keypads, OCR devices, and trackballs.

Techniques are also known in the art for making and using PC Card-based radios for applications based in a portable host. For example, see U.S. Pat. No. 5,519,577 ('577), SPREAD SPECTRUM RADIO INCORPORATED IN A PCMCIA TYPE II CARD HOLDER, assigned to Symbol Technologies, and hereby incorporated by reference.

Techniques are also known in the art for making and using disk emulation devices based on flash memory. For example, see U.S. Pat. No. 5,291,584 ('584), METHODS AND APPARATUS FOR HARD DISK EMULATION, assigned to Nexcom Technology, and hereby incorporated by reference.

Background for Relevant Application Specific Functions

Techniques are known in the art for making and using systems that download or capture compressed digital audio for storage and later playback using dedicated removable media. For example, U.S. Pat. No. 5,676,734 ('734), SYSTEM FOR TRANSMITTING DESIRED DIGITAL VIDEO OR AUDIO SIGNALS, assigned to Parsec Sight/Sound, and hereby incorporated by reference, teaches a system for transmitting digital video or audio signals over a telecommunications link from a first to a second party. In addition, U.S. Pat. No. 5,579,430 ('430), DIGITAL ENCODING PROCESS, assigned to Fraunhofer Gesellschaft zur Foerderung der angewandten Forschung e.V., and hereby incorporated by reference, teaches processes for encoding digitized analog signals. Such processes are useful for insuring high-quality reproduction while reducing transmission bandwidth and data storage requirements.

Techniques are also known in the art for making and using record and playback portable host devices based on a dedicated flash memory. For example, see U.S. Pat. No. 5,491,774 ('774), HANDHELD RECORD AND PLAYBACK DEVICE WITH FLASH MEMORY, assigned to Comp General Corporation, and hereby incorporated by reference, and U.S. Pat. No. 5,839,108 ('108), FLASH MEMORY FILE SYSTEM IN A HANDHELD RECORD AND PLAYBACK DEVICE, assigned to Norris Communications, also hereby incorporated by reference.

Limitations of Previous Approaches

In general purpose portable hosts, populating an expansion slot has meant choosing one of either removable memory or peripheral expansion for that slot. When used for memory expansion, the removable memory has been limited to use for the system or application software running on the host. In essence, the removable memory has only been used as host-dedicated memory. This was done either directly, e.g., as some portion of the main-memory of the host, or indirectly as an emulation substitute for host mass-storage (i.e., disk drives).

When used for I/O expansion, the expansion I/O-cards have not had access to a private removable media/memory. This has prevented portable computer hosts, such as PDAs, from being used as a customizable platform for many application-specific functions that require a removable memory dedicated to the application.

SUMMARY

The utility of portable computer hosts, such as PDAs, is enhanced by methods and apparatus for closed-case removable expansion cards having a removable memory in both a first and second embodiment. In both the first and second embodiments the closed-case removable expansion cards preferably use a Type II CompactFlash form factor. In the first embodiment the removable memory is in combination with an external-I/O connector or permanently attached external-I/O device, providing both I/O and memory functions in a single closed-case removable expansion card. This increases the expansion functional density for portable computer hosts, such as PDAs. That is, it increases the amount of functionality that can be accommodated within a given volume allocation for expansion devices. It also provides a viable alternative to 2-slot implementations.

In the second embodiment the removable memory is a private memory for application specific circuitry within the closed-case-removable expansion card. This enhances the utility of portable computer hosts, such as PDAs, as universal chassises for application specific uses. The standard CompactFlash physical and electrical interface couples the application specific card to the host, which provides user interface functions for the application. The cards include a top located slot and an internal connector for accepting a MultiMediaCard as the private removable memory. In addition, the application specific card will generally have some manner of I/O to required external devices, such as scanning devices, sensors, or transducers. Otherwise, all functionality for the application specific function is self-contained within the application specific card.

Particular application specific cards for customizing general purpose PDAs via the instant invention include a media-player card for digitized media stored on removable memory and a bar-code-scanner card having scanning data stored on removable memory.

BRIEF DESCRIPTION OF DRAWINGS

FIGS. 3A and 3B represent the prior art internal architecture of a generic MultiMediaCard and its registers.

FIGS. 6A and 6B compares the form factors of the prior art CompactFlash card (top) and MultiMediaCard (bottom).

DETAILED DESCRIPTION

Components of the Expansion Card

Figure 9:
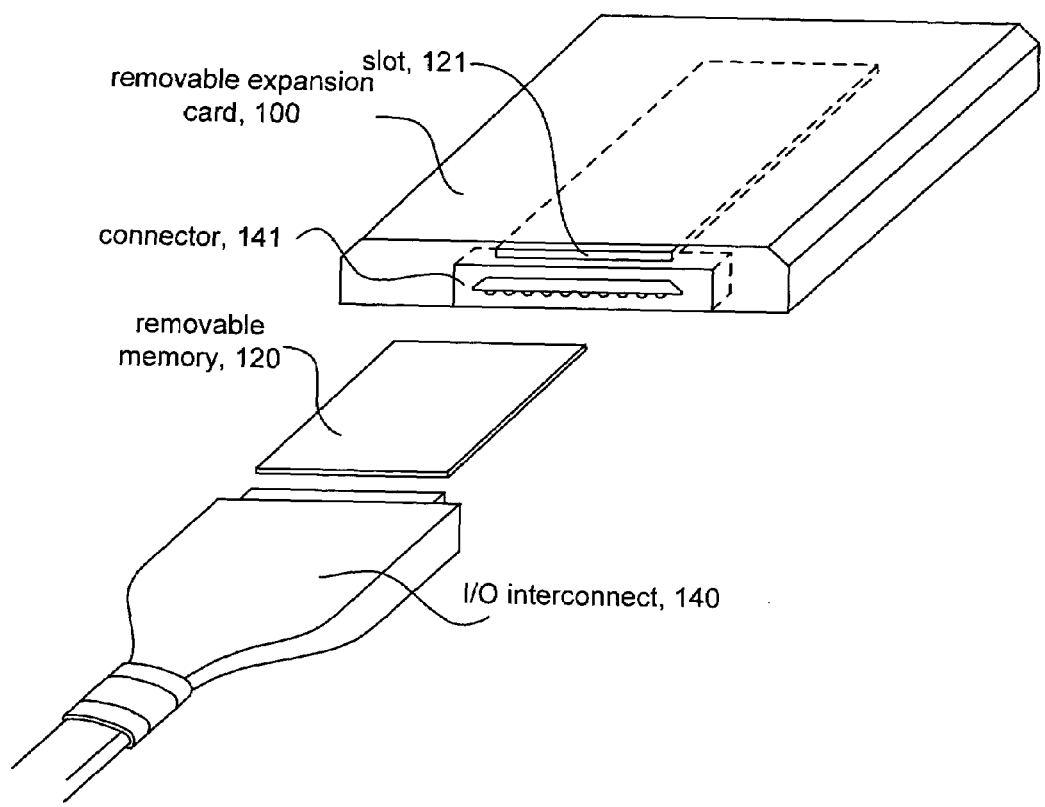
FIG. 9 is an abstract drawing representing the removable expansion card of FIG. 7 separate from the PDA, and with the I/O and memory disengaged from the removable expansion card.

FIG. 9 is an abstract drawing representing a closed-case removable expansion card 100, i.e., an expansion card that may be inserted into and removed out of a closed-case computer host. The card is especially suitable for use in a portable host, such as a PDA. In accordance with the present invention, the expansion card of FIG. 9 includes a connector 141 for I/O interconnect and a slot 121 for a removable memory. FIG. 9 shows the I/O interconnect 140 and removable memory 120 disengaged from the removable expansion card.

Figure 10:
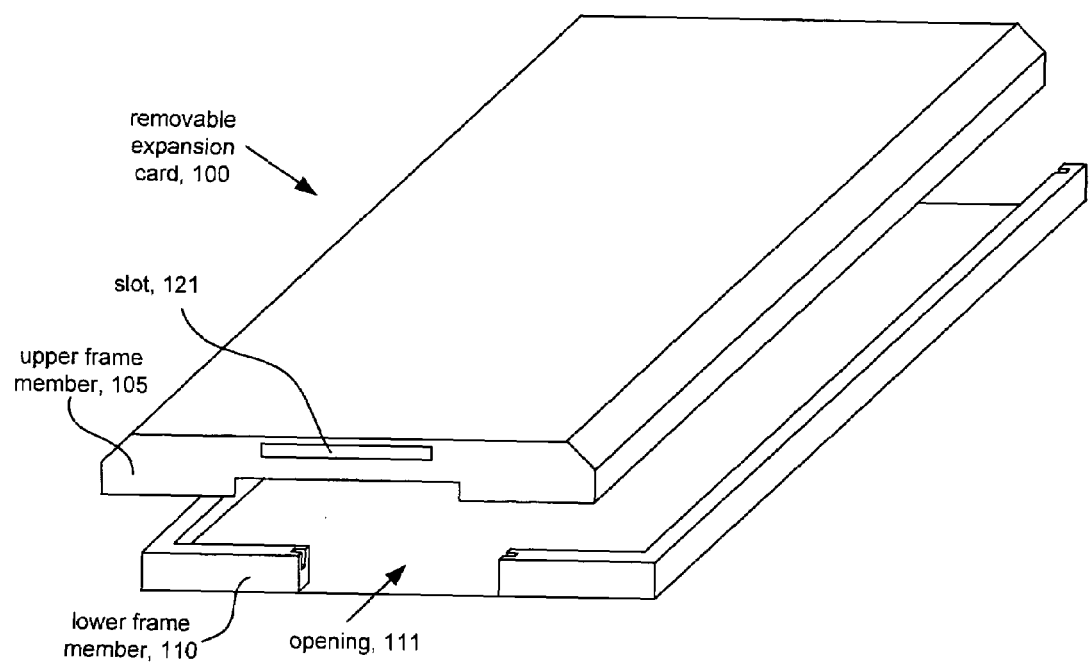
FIG. 10 is an abstract drawing representing the construction detail of the upper and lower frame of the removable expansion card of FIG. 7.

FIG. 10 is an abstract drawing representing the construction detail of the upper 105 and lower 110 frame members of the removable expansion card 100 of FIG. 9. An opening 111 is provided in the lower frame 110 for receiving the connector 141 for I/O interconnect.

Figure 11:
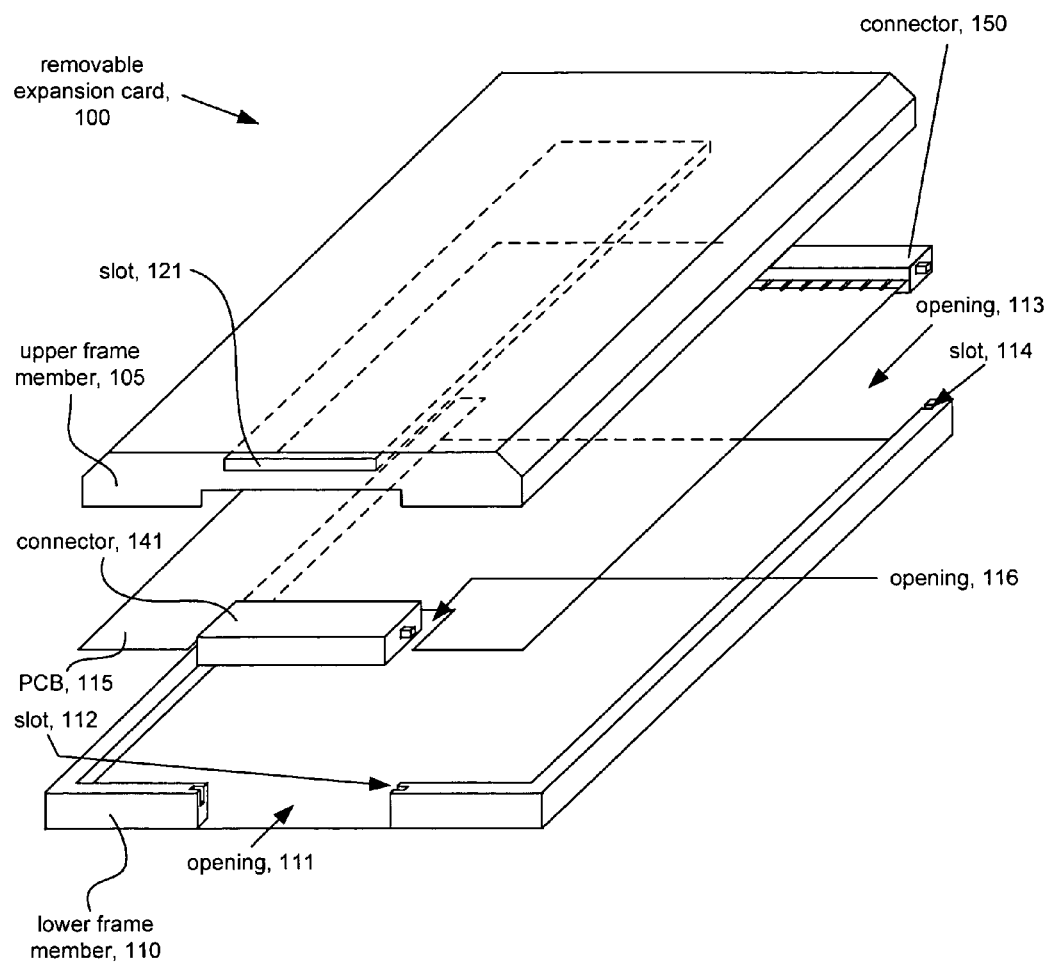
FIG. 11 is an abstract drawing representing an exploded view of the removable expansion card of FIG. 7, including the outer frame, inner PCB, and connectors.

FIG. 11 is an abstract drawing representing an exploded view of the removable expansion card 100 of FIG. 9, including the outer frame, inner PCB 115, and connectors. Visible for the first time in the view of FIG. 11, a second opening 113 is provided in the lower frame 110 for receiving the connector 150 for host interconnect. Additionally, a slot 112 is provided on both sides of the opening 111 to aid in the alignment and retention of the connector 141, and a slot 114 is provided on both sides of opening 113 to aid in the alignment and retention of the connector 150. An opening 116 is provided in the PCB for receiving the connector 141.

Figure 12A:
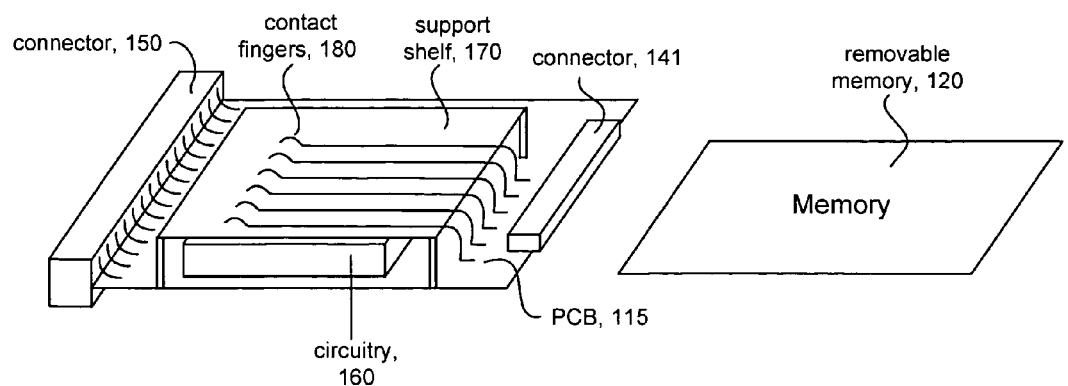
FIG. 12A is an abstract drawing representing a view of the removable expansion card of FIG. 7, with the outer frame removed, and a removable memory roughly aligned with the contact fingers to which it mates within the removable expansion card.

FIG. 12A is an abstract drawing representing a view of the removable expansion card 100 of FIG. 9, with the outer frame members removed, and a removable memory 120 roughly aligned with the contact fingers 180 to which it mates within the removable expansion card. Circuitry 160 is provided, including I/O adapter circuitry, removable memory adapter circuitry, and application-specific circuitry. A support shelf 170 supports, aligns, separates, and isolates the underside of the contact fingers 180 from the circuitry 160.

Figure 12B:
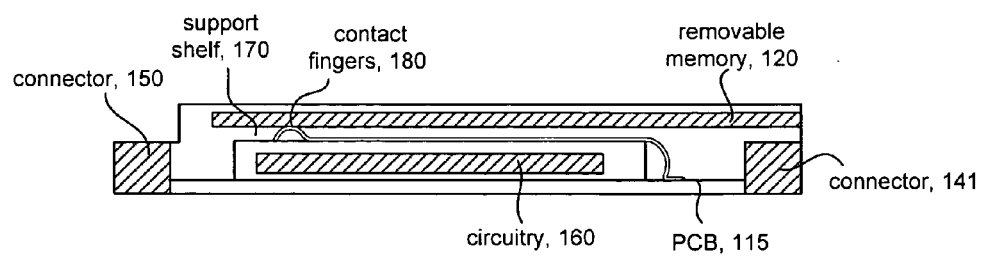
FIG. 12B is an abstract drawing representing a cut away side view of the removable expansion card of FIG. 7, with the removable memory inserted into the removable expansion card.

FIG. 12B is an abstract drawing representing a cut away side view of the removable expansion card 100 of FIG. 9, with the removable memory 120 inserted into the removable expansion card.

Figure 13A:
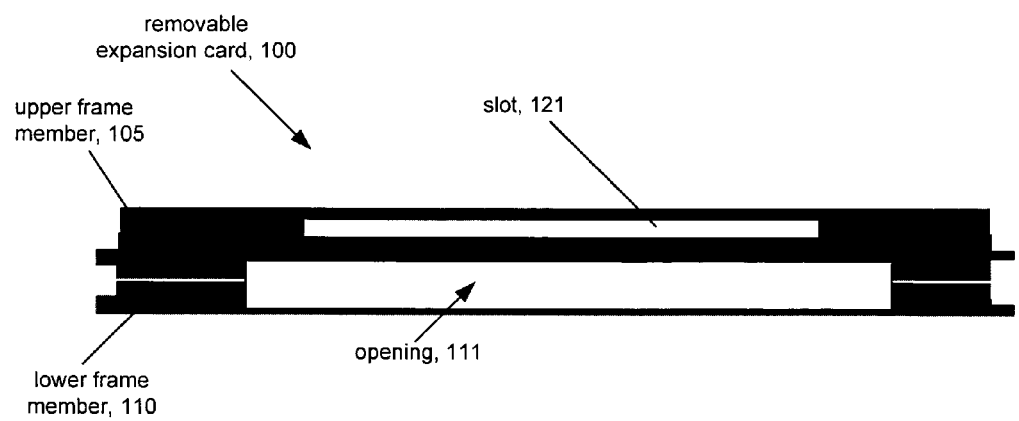
FIG. 13A is an abstract drawing representing an end view silhouette of the removable expansion card of FIG. 7.
Figure 13B:
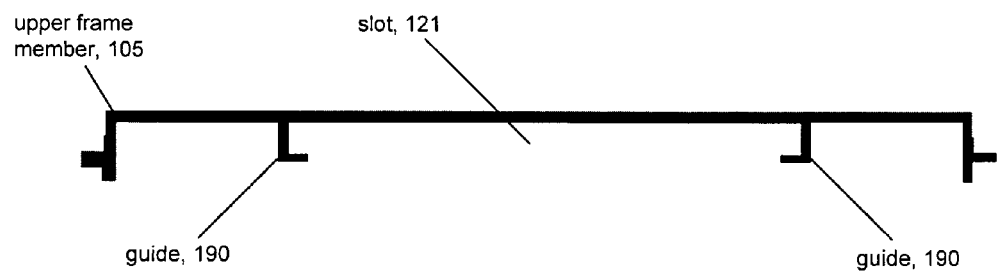
FIG. 13B is an abstract drawing representing a cross-sectional view silhouette of the upper frame member of the removable expansion card of FIG. 7.

FIG. 13A is an abstract drawing representing an end view silhouette of the removable expansion card 100 of FIG. 9. FIG. 13B is an abstract drawing representing a cross-sectional view silhouette of the upper frame member 105 of the removable expansion card 100 of FIG. 9. Guides 190 provide alignment and support for removable memory inserted via slot 121.

In a preferred embodiment, the expansion card 100 and associated host connector 150 are compatible with the Type II CompactFlash Card as described in the previously referenced CompactFlash Specification. The I/O connector 141 is compatible with a PC-Card industry standard Honda-style 15-pin connector. The slot 121, removable memory 120, and removable memory adapter circuitry of circuitry 160, are compatible with the MultiMediaCard as described in the previously referenced MultiMediaCard System Summary.

Circuitry on the Expansion Card

In a first embodiment of the invention, circuitry 160 includes I/O adapter circuitry and removable memory adapter circuitry. The I/O adapter functionality may include one or more of, but is not limited to, Ethernet, serial port, audio, telephone, antenna, and special-function interfaces such as bar code and other scanners. The removable memory adapter functionality may include one or more of, but is not limited to, main memory expansion, mass-media emulation, and other host-based special-purpose memory applications.

In accordance with a second embodiment, circuitry 160 further includes application-specific circuitry for which the management of the removable memory is an ancillary function to the primary function of the specific application. Specific examples of such application-specific expansion cards having both I/O and removable memory are provided in later sections.

Figure 1A:
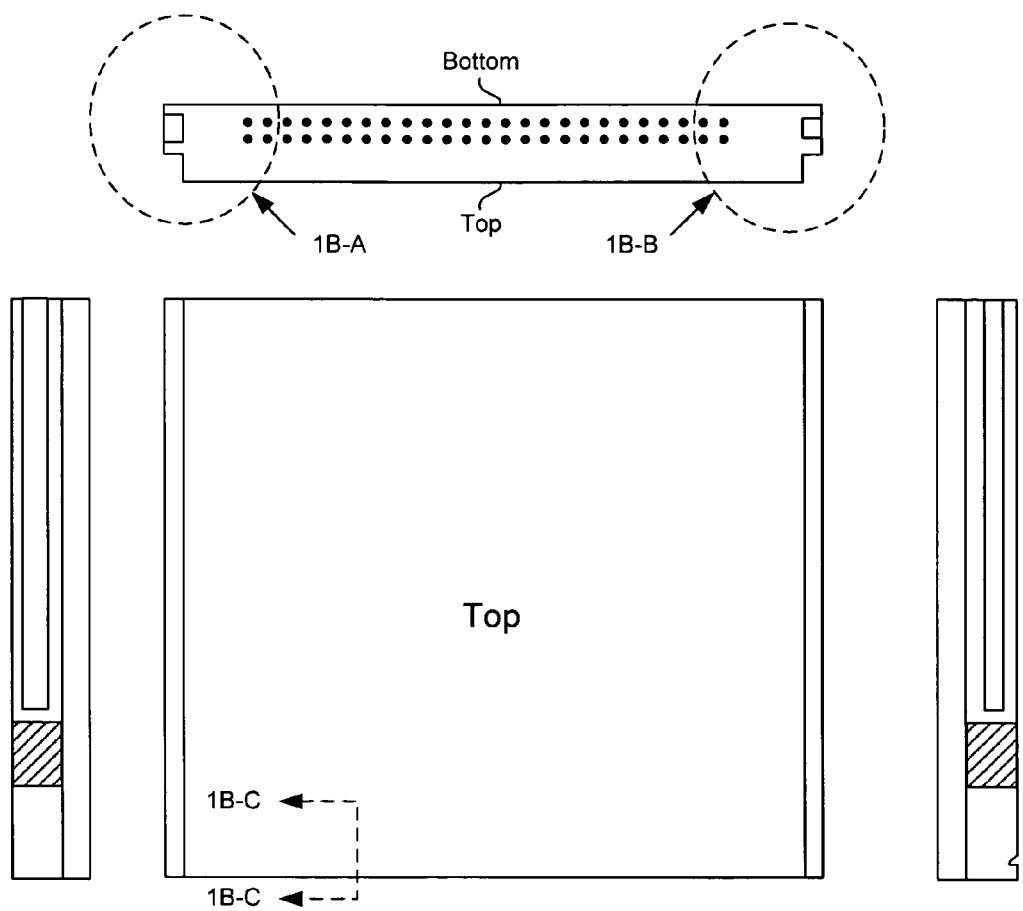
FIGS. 1A, 1B, and 1C are different views of a prior art Type II CompactFlash card.
Figure 1B:
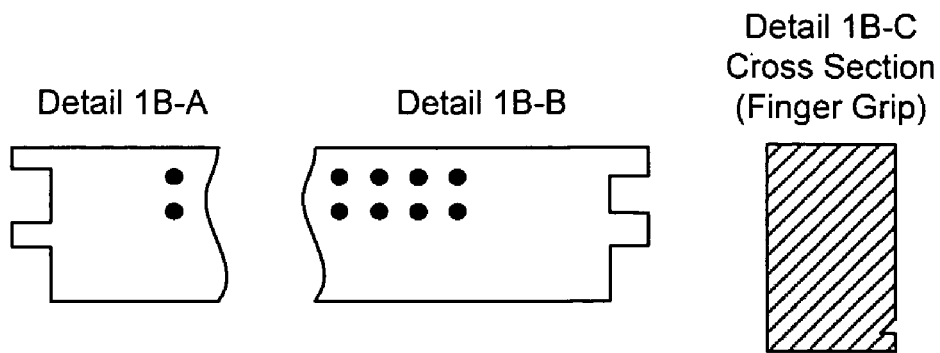
Figure 1C:
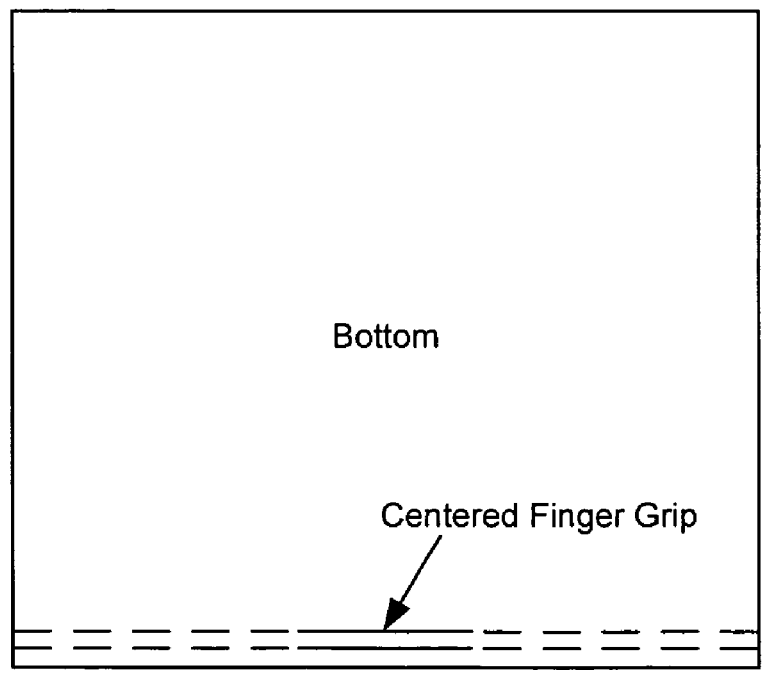
Figures 2A, 2B:
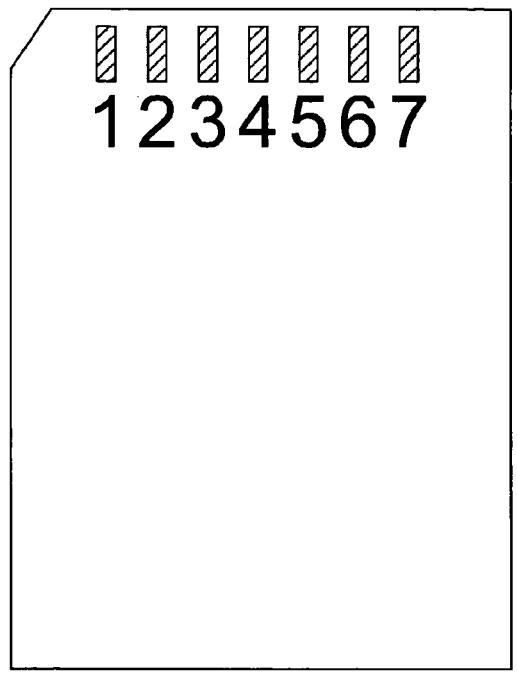
FIGS. 2A and 2B represent a prior art MultiMediaCard form factor and its pad definitions.
Figure 4:
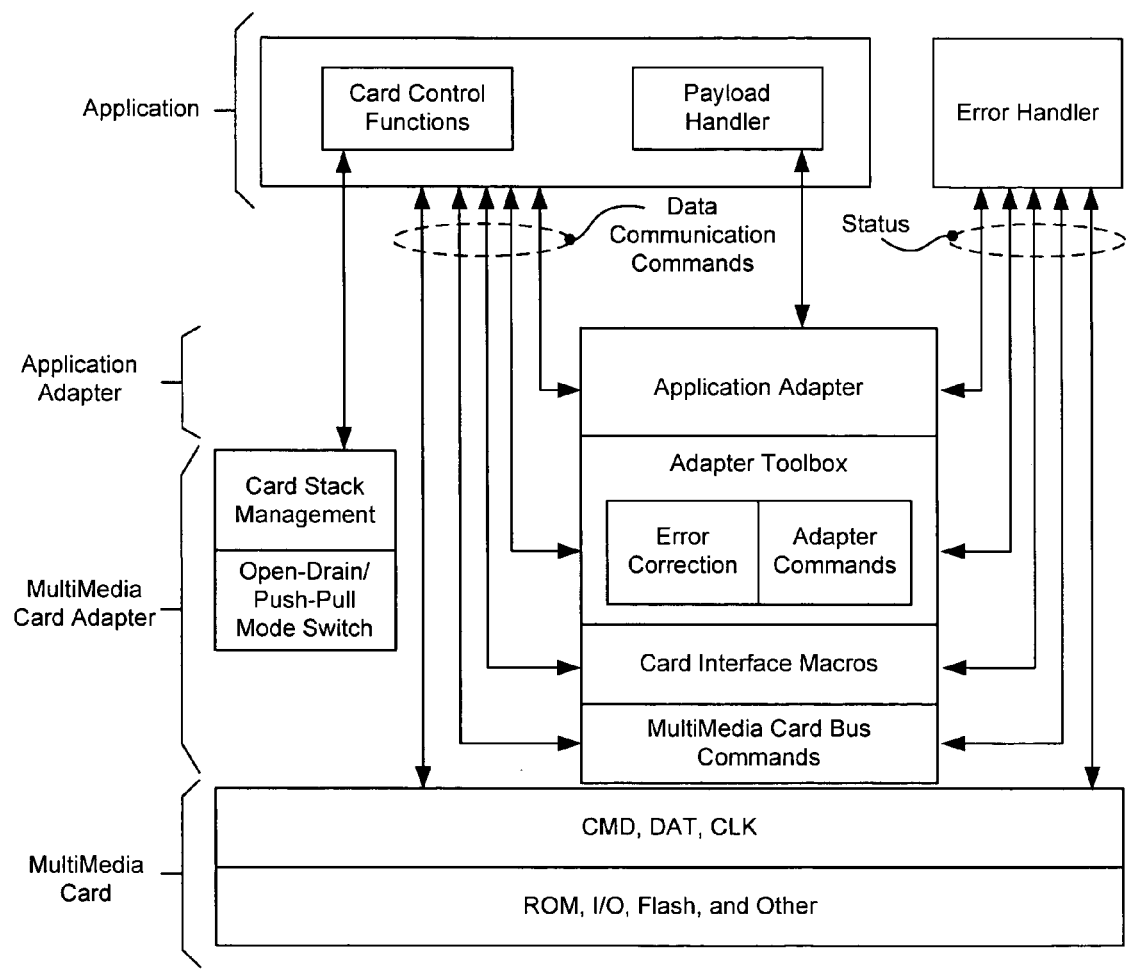
FIG. 4 illustrates the prior art functional partitioning of a generic MultiMediaCard system.
Figure 5:
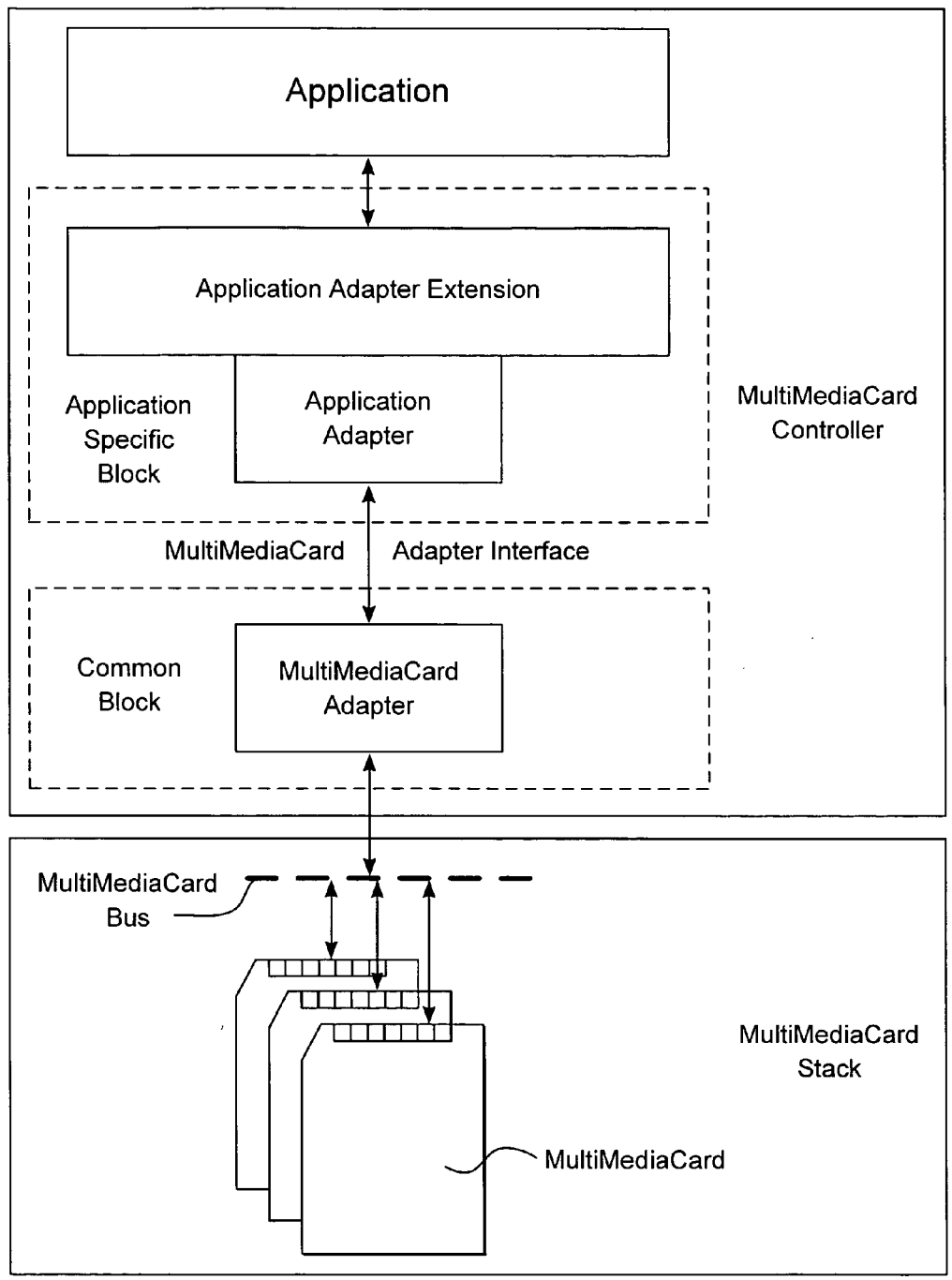
FIG. 5 illustrates the prior art physical partitioning of a generic MultiMediaCard system.
Figure 6B:
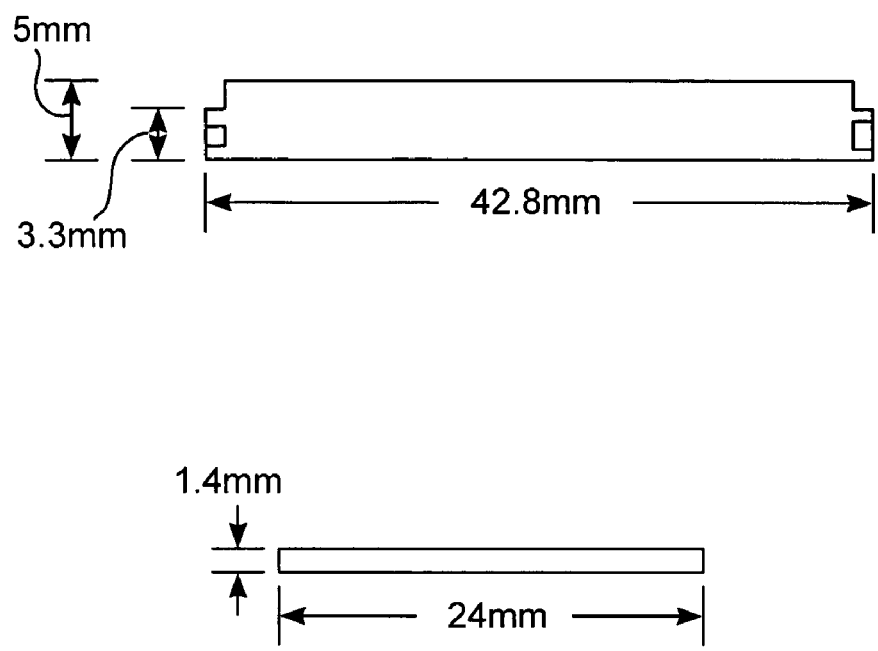

In preferred implementations of both of the first and second embodiments mentioned above, the functions performed by the removable memory are those of a MultiMediaCard adapter as illustrated in the MultiMediaCard adapter section of the MultiMediaCard system architecture diagram of FIG. 4. If the removable memory is being used to provide host-base memory expansion, such as described for the first embodiment, then the host must provide the functionality illustrated by the Application and Application Adapter sections of FIG. 4. If the removable memory is being used at least sometimes as an ancillary memory (at least sometimes private) to the application-specific circuitry contained on the expansion card, such as for the second embodiment, then the application-specific circuitry must provide the Application and Application Adapter section functionality, or else the application-specific circuitry must call on host services for such functionality.

Examples of known techniques for making and using other types of memory adapter circuitry for closed-case expansion cards or with flash memory are found in the previously referenced '145, '426, '584, '774, and '108 patents, among others. Examples of known techniques for making and using I/O adapter and application-specific circuitry for functions implemented in closed-case expansion cards and with flash memory are found in the previously referenced '374, '577, '774, and '108 patents, among others.

Frame Kit Assembly

The top and bottom frames may be composed of metal or plastic. In a preferred embodiment, the top and bottom frame portions each have a plastic base augmented with an outer metal plate over much of the interior region of the large panel surface of each portion. The metal plate extends to the edges of the panel at the connector ends of each portion and is attached to both connectors. In addition, smaller metal strips, or ears, on both sides at the finger-grip end (opposite to the host connector) extend from the plate to the edges of the panel and continue onto the sides. The frame kit is assembled and the side strips are sonically welded together on both sides of the casings. The welded strips and plates form a single continuous metal band around the top and bottom frames that permanently physically retains the assembled kit.

I/O Interconnect Options

I/O devices may be interconnected with the expansion card via three different embodiments. First, a PC-Card industry-standard Honda-style 15-pin connector may be used with a mating detachable cable. Detachable cables are preferred for light-duty applications where a continuous I/O device connection is neither needed nor desired. Second, a fully integrated fixed cable, having a molded strain relief may be used. Such a fixed cable maintains solid contact in high vibration environments, is protected against lateral stress, and seals out dust. Fixed cables are preferred for dedicated industrial or field applications. Third, at least a portion of the I/O device may be abutted and attached (often via a snap-in-place mechanism) directly to the expansion card, obviating the need for either a detachable or fixed cable. Cableless snap-on I/O devices are preferred for small mostly self-contained I/O devices that permit a compact PDA, expansion-card, I/O-device combination that handles physically as a single piece of equipment. In the instant invention, such snap-on I/O devices must make allowance for the removable memory.

PDA Having Application Specific Card with Removable Media

Figure 7:
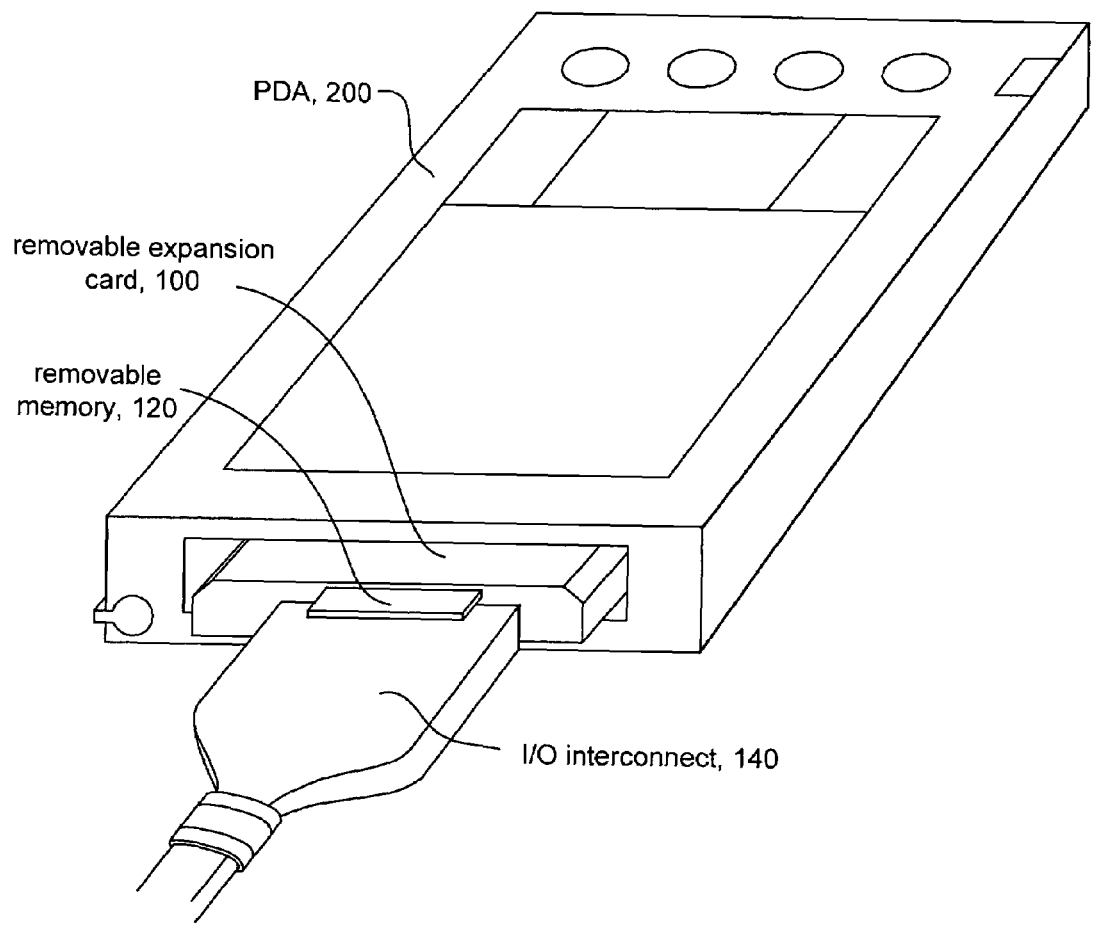
FIG. 7 illustrates a PDA equipped with a removable expansion card having both I/O and removable memory in accordance with the present invention.
Figure 8:
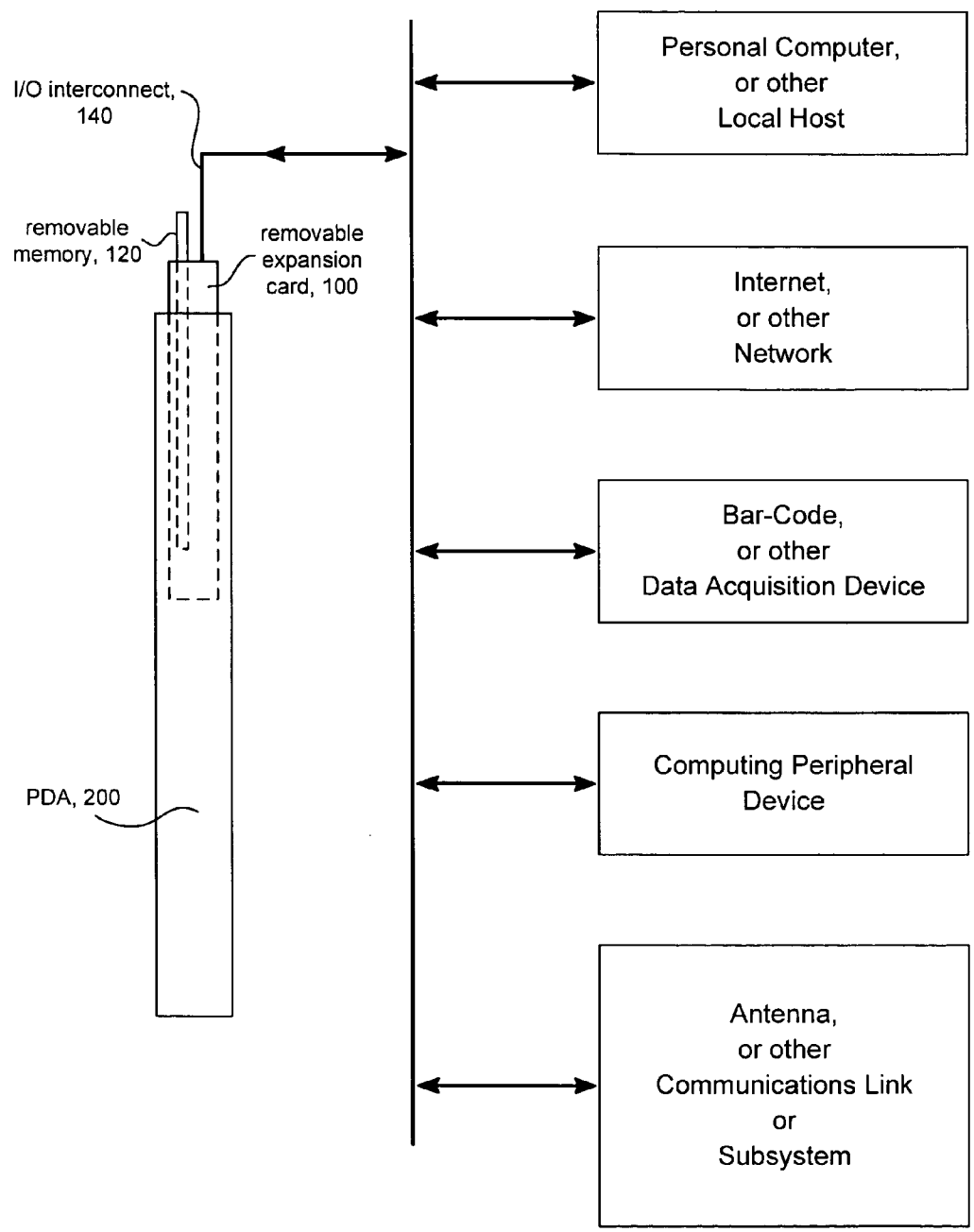
FIG. 8 illustrates some of the various types of I/O for which the PDA and removable expansion card of FIG. 7 may be equipped.

FIG. 7 illustrates a PDA 200 equipped with a removable expansion card 100 having both I/O interconnect 140 and removable memory 120 in accordance with the present invention. The application specific circuitry of the expansion card may be used in conjunction with application specific software running on the PDA. This permits the application specific circuitry of the expansion card to make use of the output (e.g., display, sound) and input (e.g., tablet, buttons, any I/O ports) capabilities of the PDA for user interface functions associated with the specific application. In particular the PDA's display/input-tablet provides for virtual controls and visual indicators for the application. FIG. 8 illustrates some of the various types of I/O for which the PDA and removable expansion card of FIG. 7 may be equipped. Application-specific functions may include special-function mixed-signal electronics, special-function I/O, special-function data-pumps, and special-function accelerators.

Application Specific Embodiments

Generic Removable Media Applications

The present invention enables general-purpose portable hosts to perform application-specific functions requiring dedicated ROM. A first large ROM-based application category is that of prerecorded media, such as music, audio, video, and text (for books, newspapers, and other publications). A second large ROM-based application category is customization for programmable devices, such as games, language translators, and other devices having "personality" modules.

The present invention also enables general-purpose portable hosts to perform application-specific functions requiring non-volatile read/write memory for data-capture, data-logging, data-checkpoints or backups, transaction logging, and data-transport.

In the illustrated embodiments the non-volatile read/write memory is flash memory in accordance with the standard MultiMediaCard. Such removable flash-memory-based application-specific functions have particular utility to medical and other data acquisition, secure commerce, financial and personal productivity devices making use of unique removable memories for each of multiple individuals, projects, or accounts.

The removable flash-based memory is also well suited where "sneaker-net" is a viable data transport. Provided manual/user intervention is acceptable, and depending on the speed of data link I/O incorporated into the expansion card, the physical transport of a removable memory device between a PDA-based expansion card and an external system may provide the best solution to fast local transport of large data-sets. For similar reasons, the use of removable memory devices may provide the best solution to rapidly reconfiguring an application-specific expansion card to initiate a large program or use a large data sets. The use of labeled, color-coded, or otherwise distinctive, removable memory devices also may provide the best solution for ease of use for users needing to select a particular program or data set from many for reconfiguring an application specific expansion card.

Specific Application Examples

Media Player Application

The present invention permits a general purpose PDA to be customized (specially adapted) for use as a portable/wearable media player, at the highest-level of functionality not unlike a portable Compact Disk player. Such a player uses the removable memory to store and playback digitally encoded media such as music, audio, or video. In a preferred embodiment the player makes use of the MPEG Layer 3 standard for digital audio encoding, generally known as MP3. Another embodiment makes use of the Microsoft Digital Audio standard. Other aspects of a preferred embodiment include an integral AM/FM receiver, a connector for a headset with an integral antenna for the receiver, and an auto-start on insert feature that initiates the media playback upon insertion of the removable memory. The PDA's display/input-tablet provides the virtual controls and visual indicators for the media player.

Module for Subscriber Services

In accordance with the present invention, an expansion card having I/O and removable memory is inserted into a computer host. The I/O is coupled to a receiver capable of receiving a large number of broadcast messages and services. The removable memory contains subscriber services information for each individual user. The expansion card uses the subscriber services information to filter out messages and services not applicable to the present status of the subscriber. The PDA's display/input-tablet provides the virtual controls and visual indicators for the display and access of captured messages and services.

Bar-Code Scanning Application (a Backup Storage Example)

In accordance with the present invention, an expansion card having I/O and removable memory is inserted into a computer host, a bar-coding peripheral is connected to the I/O portion of the card, and a removable memory card is inserted into the memory slot of the card. After each scan the scanned information is transferred through the I/O connection to the host computer for processing. Additionally, a backup copy of the scanned information is stored on the removable memory. Should the computer host fail or should the operator need to verify scans, the backup can be interrogated with the same or a different host.

Personal Environmental and Medical Monitoring Devices

The present invention permits a general purpose PDA to be customized as a portable/wearable personal environmental monitor. Equipped with the appropriate sensors and application-specific circuitry for sensor signal processing, such a device performs time-stamped data logging of environmental attributes such as ionizing radiation, temperature, and humidity. Similarly, a portable/wearable personal medial monitor data logs health-related attributes such as pulse, temperature, respiration, and blood pressure. The PDA's display/input-tablet provides the virtual controls and visual indicators for the monitoring devices.

Automotive and Industrial Diagnostic Monitoring and Control

The combined I/O interconnect and removable memory of the present invention also permits a general purpose PDA to be customized (specially adapted) for use as a data logging diagnostic monitor or time-based control device. It is known that the diagnostic connectors of certain vehicles can be adapted to interface with PDAs for real-time monitoring of critical vehicle subsystems. The present invention permits such diagnostic monitoring data to be communicated via the I/O interconnect and logged to the removable memory. Such a tool facilitates tracking subsystem performance over extended periods of time, and permits real-time and deferred graphics of time-varying system performance attributes. The PDA's display/input-tablet provides the virtual controls and visual indicators for the diagnostic monitor.

Conclusion

Although the present invention has been described using particular illustrative embodiments, it will be understood that many variations in construction, arrangement and use are possible within the scope of the invention. For example the number of I/O interconnects, removable memories, contact fingers, number and type of application-specific circuits, and the size, speed, and type of technology used may generally be varied in each component of the invention. The invention is not limited to the standard CompactFlash form factor, but other closed-case removable expansion card form factors are equally applicable. Nor is the invention limited to use of the standard MultiMediaCard, as other types of removable memory or media may also be employed. Functionally equivalent techniques known to those skilled in the art may be employed instead of those illustrated to implement various components. The present invention is thus to be construed as including all possible modification and variations encompassed within the scope of the appended claims.

We claim:

1. An expansion module for use in conjunction with a removable expansion card, an I/O device, and a computing host having an externally accessible first expansion coupling, the expansion module comprising:
   a CompactFlash card adapted to directly removably attach with the computing host via the first expansion coupling, the CompactFlash card including a second expansion coupling, adapter circuitry to manage data transfers with the removable expansion card, and an I/O interface adapted to couple with the I/O device;
   wherein independent of the attachment of the CompactFlash card to the computing host, the second expansion coupling is externally accessible and is adapted to directly removably attach with the removable expansion card, the removable expansion card nesting within the CompactFlash card when attached thereto; and
   wherein the first externally accessible coupling and the second externally accessible coupling are respectively a first-level coupling and a second-level coupling, the expansion module is first-level module adapted to couple to the computing host via the first-level coupling, the removable expansion card is a second-level module adapted to couple to the first-level module via the second-level coupling, and the data transfers include transferring information between the first-level module and the second-level module.

2. The expansion module of claim 1, wherein the computing host is a portable host.

3. The expansion module of claim 1, wherein the computing host is a PDA.

4. The expansion module of claim 1, wherein the removable expansion card is a removable memory.

5. The expansion module of claim 1, wherein the CompactFlash card is a first removable expansion card and the removable expansion card is a second removable expansion card.

6. The expansion module of claim 5, wherein the first removable expansion card nests within the computing host when attached thereto.

7. The expansion module of claim 1, wherein the I/O device is permanently attached to the I/O interface.

8. The expansion module of claim 1, wherein the I/O device is removably attached to the I/O interface.

9. The expansion module of claim 1, wherein:
   the first expansion coupling includes a first slot; and
   the second expansion coupling includes a second slot.

10. The expansion module of claim 1, wherein the I/O interface is adapted to couple to an antenna external to the CompactFlash card.

11. The expansion module of claim 1, wherein the I/O interface is adapted to couple to a communications link external to the CompactFlash card.

12. The expansion module of claim 1, wherein the I/O interface is adapted to couple to a communications subsystem external to the CompactFlash card.

13. The expansion module of claim 1, wherein the I/O interface is coupled to a receiver.

14. The expansion module of claim 1, wherein the I/O interface includes a telephone interface.

15. The expansion module of claim 1, wherein the I/O interface includes an antenna interface.

16. The expansion module of claim 1, wherein the I/O interface includes a network interface.

17. The expansion module of claim 1, wherein the I/O interface includes a serial interface.

18. The expansion module of claim 1, wherein the removable expansion card is a MultiMediaCard card.

19. An expansion module for use in conjunction with a MultiMediaCard card, an I/O device, and a computing host having an externally accessible first expansion coupling, the expansion module comprising:
   an assembly adapted to directly removeably attach with the computing host via the first expansion coupling, the assembly including a second expansion coupling, adapter circuitry to manage data transfers with the MultiMediaCard card, and an I/O interface adapted to couple with the I/O device;
   wherein independent of the attachment of the computing host, the second expansion coupling is externally accessible and is adapted to directly removably attach with the MultiMediaCard card, the MultiMediaCard card nesting within the assembly when attached thereto; and
   wherein the first externally accessible coupling and the second externally accessible coupling are respectively a first-level coupling and a second-level coupling, the expansion module is a first-level module adapted to couple to the computing host via the first-level coupling, the MultiMediaCard card is a second-level module adapted to couple to the first-level module via the second-level coupling, and the data transfers include transferring information between the first-level module and the second-level module.

20. The expansion module of claim 19, wherein the computing host is a portable host.

21. The expansion module of claim 19, wherein the computing host is a PDA.

22. The expansion module of claim 19, wherein the MultiMediaCard card is a removable memory.

23. The expansion module of claim 19, wherein the assembly is a first removable expansion card and the MultiMediaCard card is a second removable expansion card.

24. The expansion module of claim 23, wherein the first removable expansion card nests within the computing host when attached thereto.

25. The expansion module of claim 19, wherein the I/O device is permanently attached to the I/O interface.

26. The expansion module of claim 19, wherein the I/O device is removably attached to the I/O interface.

27. The expansion module of claim 19, wherein:
the first expansion coupling includes a first slot; and
the second expansion coupling includes a second slot.

28. The expansion module of claim 19, wherein the I/O interface is adapted to couple to an antenna external to the assembly.

29. The expansion module of claim 19, wherein the I/O interface is adapted to couple to a communications link external to the assembly.

30. The expansion module of claim 19, wherein the I/O interface is adapted to couple to a communications subsystem external to the assembly.

31. The expansion module of claim 19, wherein the I/O interface is coupled to a receiver.

32. The expansion module of claim 19, wherein the I/O interface includes a telephone interface.

33. The expansion module of claim 19, wherein the I/O interface includes an antenna interface.

34. The expansion module of claim 19, wherein the I/O interface includes a network interface.

35. The expansion module of claim 19, wherein the I/O interface includes a serial interface.

36. The expansion module of claim 19, wherein the assembly is a CompactFlash card.

37. An expansion module for use in conjunction with at least one removable expansion card, an I/O device, and a computing host having an externally accessible first expansion coupling, each removable expansion card being of one of a plurality of card types, the expansion module comprising:
an assembly adapted to directly removably attach with the computing host via the first expansion coupling, the assembly including a second expansion coupling, adapter circuitry to manage data transfers with the at least one removable expansion card, and an I/O interface adapted to couple with the I/O device;
wherein independent of the attachment of the assembly to the computing host, the second expansion coupling is externally accessible and is adapted to directly removably attach with the at least one removable expansion card, the at least one removable expansion card nesting within the assembly when attached thereto; and
wherein the first externally accessible coupling and the second externally accessible coupling are respectively a first-level coupling and a second-level coupling, the expansion module is a first-level module adapted to couple to the computing host via the first-level coupling, the at least one removable expansion card is a second-level module adapted to couple to the first-level module via the second-level coupling, the data transfers include transferring information between the first-level module and the second-level module, and the expansion module is adapted for use with at least a MultiMediaCard card type of the plurality of card types.

38. The expansion module of claim 37, wherein the computing host is a portable host.

39. The expansion module of claim 37, wherein the computing host is a PDA.

40. The expansion module of claim 37, wherein the at least one removable expansion card is a removable memory.

41. The expansion module of claim 37, wherein the assembly is a first removable expansion card and the at least one removable expansion card is a second removable expansion card.

42. The expansion module of claim 41, wherein the first removable expansion card nests within the computing host when attached thereto.

43. The expansion module of claim 37, wherein the I/O device is permanently attached to the I/O interface.

44. The expansion module of claim 37, wherein the I/O device is removably attached to the I/O interface.

45. The expansion module of claim 37, wherein:
the first expansion coupling includes a first slot; and
the second expansion coupling includes a second slot.

46. The expansion module of claim 37, wherein the I/O interface is adapted to couple to an antenna external to the assembly.

47. The expansion module of claim 37, wherein the I/O interface is adapted to couple to a communications link external to the assembly.

48. The expansion module of claim 37, wherein the I/O interface is adapted to couple to a communications subsystem external to the assembly.

49. The expansion module of claim 37, wherein the I/O interface is coupled to a receiver.

50. The expansion module of claim 37, wherein the I/O interface includes a telephone interface.

51. The expansion module of claim 37, wherein the I/O interface includes an antenna interface.

52. The expansion module of claim 37, wherein the I/O interface includes a network interface.

53. The expansion module of claim 37, wherein the I/O interface includes a serial interface.

54. The expansion module of claim 37, wherein the assembly is a CompactFlash card.

* * * * *